US011229927B2

(12) United States Patent
Tan et al.

(10) Patent No.: US 11,229,927 B2
(45) Date of Patent: Jan. 25, 2022

(54) ULTRASOUND TRANSDUCER AND METHOD OF FORMING IHE SAME

(71) Applicant: AGENCY FOR SCIENCE, TECHNOLOGY AND RESEARCH, Singapore (SG)

(72) Inventors: Xing Haw Marvin Tan, Singapore (SG); Yuandong Alex Gu, Singapore (SG); Liang Lou, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 943 days.

(21) Appl. No.: 15/770,181

(22) PCT Filed: Oct. 13, 2016

(86) PCT No.: PCT/SG2016/050504
§ 371 (c)(1),
(2) Date: Apr. 20, 2018

(87) PCT Pub. No.: WO2017/069701
PCT Pub. Date: Apr. 27, 2017

(65) Prior Publication Data
US 2018/0304309 A1 Oct. 25, 2018

(30) Foreign Application Priority Data
Oct. 21, 2015 (SG) .......................... 10201508703U

(51) Int. Cl.
*B06B 1/06* (2006.01)
*B32B 43/00* (2006.01)
(Continued)

(52) U.S. Cl.
CPC .......... *B06B 1/0688* (2013.01); *B06B 1/0603* (2013.01); *B06B 1/064* (2013.01);
(Continued)

(58) Field of Classification Search
CPC ..... B06B 1/0688; B06B 1/0603; B06B 1/064; H01L 41/0973
(Continued)

(56) References Cited

U.S. PATENT DOCUMENTS 4,379,212 A 4/1983 Martin
6,359,367 B1 3/2002 Sumanaweera et al.
(Continued)

FOREIGN PATENT DOCUMENTS

CN 101645484 A 2/2010
CN 105170435 A 12/2015
(Continued)

OTHER PUBLICATIONS

Guedes et al., "Aluminum nitride pMUT based on a flexurally-suspended membrane," Solid-State Sensors, Actuators and Microsystems Conference (TRANSDUCERS), 2011 16th International, pp. 2062-2065, Jun. 5-9, 2011.
(Continued)

*Primary Examiner* — Derek J Rosenau
(74) *Attorney, Agent, or Firm* — Womble Bond Dickinson (US) LLP

(57) ABSTRACT

Embodiments provide an ultrasound transducer. The ultrasound transducer may include a multi-layered membrane having a plurality of slits extending through the membrane, thereby forming a plurality of sections of the membrane at least partially separated by the slits. Each slit extends from a perimeter of the membrane to a respective end position at a predetermined distance away from a center of the membrane. The plurality of sections of the membrane are connected to each other at the center of the membrane.

20 Claims, 7 Drawing Sheets

(51) Int. Cl.
*H01L 41/09* (2006.01)
*H04R 17/00* (2006.01)

(52) U.S. Cl.
CPC ........ *B32B 43/003* (2013.01); *H01L 41/0973* (2013.01); *H04R 17/00* (2013.01)

(58) Field of Classification Search
USPC ........................................ 310/321, 322, 324
See application file for complete search history.

(56) References Cited

U.S. PATENT DOCUMENTS

| | | | |
|---|---|---|---|
| 7,161,279 | B2 | 1/2007 | Topliss et al. |
| 2005/0105753 | A1 | 5/2005 | Manzini et al. |
| 2012/0053393 | A1* | 3/2012 | Kaltenbacher ....... H04R 25/606 600/25 |
| 2015/0145374 | A1 | 5/2015 | Xu et al. |
| 2017/0021391 | A1* | 1/2017 | Guedes ................ B06B 1/0603 |

FOREIGN PATENT DOCUMENTS

| | | |
|---|---|---|
| EP | 2519030 A1 | 10/2012 |
| JP | 5491080 B2 | 5/2014 |
| WO | WO 2007/067282 A2 | 6/2007 |
| WO | WO 2016/054447 A1 | 4/2016 |

OTHER PUBLICATIONS

Rozen et al., "Variable Thickness Diaphragm for a Stress Insensitive Wideband Piezoelectric Micromachined Ultrasonic Transducer", Hilton Head 2014 Solid-State Sensors, Actuators & Microsystems Workshop, Hilton Head Island.
IP Office of Singapore—Notification of Transmittal of the International Search Report & the Written Opinion of the International Searching Authority, or the Declaration, with the International Search Report & Written Opinion dated Oct. 26, 2016 for International Application No. PCT/SG2016/050364 (10 pgs).

* cited by examiner

ULTRASOUND TRANSDUCER AND METHOD OF FORMING THE SAME

CROSS-REFERENCE TO RELATED APPLICATIONS

This patent application is a U.S. National Phase application under 35 U.S.C. § 371 of International Application No. PCT/SG2016/050504, filed on 13 Oct. 2016, entitled ULTRASOUND TRANSDUCER AND METHOD OF FORMING THE SAME, which claims the benefit of Singapore patent application No. 10201508703U filed on 21 Oct. 2015, the entire contents of which were incorporated by reference for all purposes.

TECHNICAL FIELD

Embodiments relate generally to an ultrasound transducer and a method of forming an ultrasound transducer.

BACKGROUND

Ultrasound transducers, such as piezoelectric micromachined ultrasound transducers, are normally made of multi-layered membranes, which are usually circular in shape and clamped around their circumference. The multi-layered membranes of piezoelectric micromachined ultrasound transducers usually include a layer of piezoelectric material sandwiched between electrode layers, for example, two molybdenum layers. When an alternating potential difference is applied across the piezoelectric material, the entire membrane bends up and down, in order for the membrane to bend, the membrane should change from a shape of a flat circular disk, to a shape approximating a hemisphere. Because the membrane is clamped around its circumference, the radius of the membrane does not change. The surface area of a circle is $\pi r^2$, while the surface area of a hemisphere is $2\pi r^2$. This means that for the membrane to bend, the surface area of the membrane must be increased. However, the stiffness of the materials in the membrane makes it difficult for the membrane to be expanded.

Contemporary designs for ultrasound transducers propose etching large holes near the perimeter of the membrane in order to suspend the inner membrane area on multiple legs or anchors. This design is to make the membrane more flexible, in order to achieve a piston-like actuation. However, this approach etches away valuable piezoelectric material for actuation.

On the other hand, the displacement of the membrane determines the acoustic pressure generated by the ultrasound transducer. Large acoustic pressure is desired for wave to travel far and for greater signal-to-noise ratio, e.g. for high resolution imaging.

SUMMARY

Various embodiments provide an ultrasound transducer. The ultrasound transducer may include a multi-layered membrane having a plurality of slits extending through the membrane, thereby forming a plurality of sections of the membrane at least partially separated by the slits. Each slit extends from a perimeter of the membrane to a respective end position at a predetermined distance away from a center of the membrane. The plurality of sections of the membrane are connected to each other at the center of the membrane.

Various embodiments further provide a method of forming an ultrasound transducer. The method may include providing a multi-layered membrane; and forming a plurality of slits extending through the membrane, thereby forming a plurality of sections of the membrane at least partially separated by the slits. Each slit may extend from a perimeter of the membrane to a respective end position at a predetermined distance away from a center of the membrane. The plurality of sections of the membrane may be connected to each other at the center of the membrane.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
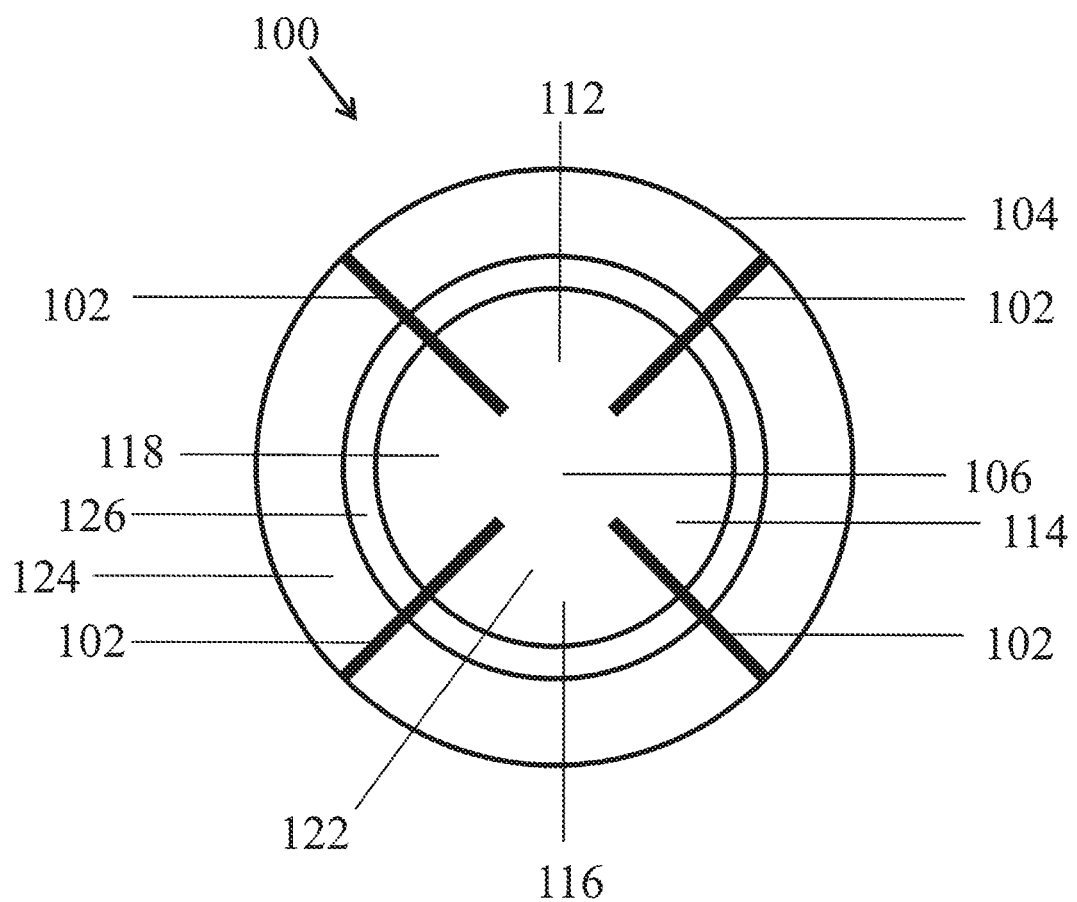
FIG. 1 shows a schematic diagram illustrating an ultrasound transducer according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized, and structural and logical changes may be made without departing from the scope of the invention. The various embodiments are not necessarily mutually exclusive, as some embodiments can be combined with one or more other embodiments to form new embodiments.

Various embodiments provide an ultrasound transducer enabling easier expansion of the membrane while maximizing the area of the membrane. The ultrasound transducer of various embodiments allows larger displacement of the membrane, and thus generates higher acoustic pressure, thereby allowing wave to travel far and achieving higher signal-to-noise ratio.

Various embodiments provide an ultrasound transducer. The ultrasound transducer may include a multi-layered membrane having a plurality of slits extending through the membrane, thereby forming a plurality of sections of the membrane at least partially separated by the slits. Each slit extends from a perimeter of the membrane to a respective end position at a predetermined distance away from a center of the membrane. The plurality of sections of the membrane are connected to each other at the center of the membrane.

In other words, various embodiments provide an ultrasound transducer, in which narrow slits are formed in the multi-layered membrane to form a plurality of sections of the membrane at least partially decoupled with each other, which allows for greater displacement and expansion of the membrane. The end of each slit stops at a distance away from the center of the membrane, so that the center portion of the membrane connects the plurality of decoupled sections of the membrane together, thereby allowing the decoupled sections of the membrane remain in phase during vibration.

According to various embodiments, the plurality of slits may extend through the membrane along a direction at least substantially perpendicular to the membrane. The plurality of slits may extend through the membrane along other directions in other embodiments, e.g. along an oblique direction through the layers of the membrane. The plurality of slits may extend through the entire thickness of the membrane, in other words, the slits may extend through all layers of the multi-layered membrane.

In various embodiments, each slit may extend radially from the perimeter of the membrane to the respective end position at the predetermined distance away from the center of the membrane. The plurality of slits may extend radially to converge towards the center portion of the membrane. By way of example, the longitudinal axis of each slit may extend radially towards the center portion of the membrane.

In various embodiments, each slit may extend along a radius of the membrane from the perimeter of the membrane to the respective end position. For example, the line connecting the two ends of the slit may extend along the radius of the membrane, or the longitudinal axis of the slit may extend along the radius of the membrane.

In various embodiments, a tangent at the end portion of each slit may be through the center of the membrane. In other embodiments, the tangent at the end portion of each slit may not be through the center of the membrane.

According to various embodiments, the plurality of slits may be substantially evenly disposed in the membrane, so as to at least partially separate the membrane into the plurality of sections having substantially equal areas, thereby ensuring that resonant frequencies of the plurality of sections are matched with each other. In other embodiments, the plurality of slits may be unevenly disposed in the membrane, and the plurality of sections of the membranes separated thereby may have different area with each other, thereby achieving broadband frequencies of the multi-layered membrane.

According to various embodiments, the center of the membrane may be a center of gravity of the membrane. The center of the membrane may be a point at the center of gravity of the membrane. The plurality of sections of the membrane may be connected to each other at the center portion of the membrane, wherein the center portion is an area including the center of the membrane. By way of example, the center portion may be a circular area at the center of the membrane, or may be an area of other shapes including the center of the membrane.

According to various embodiments, the multi-layered membrane may be a disc-shaped membrane. In various embodiments, the multi-layered membrane may be in other suitable shapes, e.g., ellipse, square, rectangle, polygon, etc.

According to various embodiments, the multi-layered membrane may be clamped around at least a portion of the perimeter.

According to various embodiments, each slit may be one of a rectangular shaped slit or a spiral shaped slit. The slits may also be any other shaped slit, e.g., curved slit, tapered slit, etc.

According to various embodiments, each slit may have a width in a range of 0.1%-15% of a radius of the multi-layered membrane. By way of example, the width of each slit may be about 0.2%, 0.5%, 0.8%, 1%, 5%, 8%, 10%, 12%, or 14% of the radius of the multi-layered membrane.

According to various embodiments, a length of each slit is in a range of 10%-90% of a radius of the multi-layered membrane. By way of example, the length of each slit may be about 15%, 20%, 40%, 60%, or 80% of the radius of the multi-layered membrane.

Accordingly, according to various embodiments, the end positions of the plurality of slits are located at the predetermined distance away from the center of the membrane, wherein the predetermined distance may be in a range of 10%-90% of the radius of the membrane. According to various embodiments, the end positions of the plurality of slits may be located at the same predetermined distance from the center of the membrane, thereby ensuring that resonant frequencies of the plurality of sections of the membrane are matched with each other. According to various embodiments, the end positions of the plurality of slits may be located at different predetermined distances away from the center of the membrane, thereby achieving broadband frequencies of the multi-layered membrane.

According to various embodiments, the length of each slit is substantially larger than the width, which forms narrow slits to maximize the remaining sections of the membrane.

According to various embodiments, the multi-layered membrane may include a substrate, a first electrode layer arranged on the substrate, a piezoelectric layer arranged on the first electrode layer, and a second electrode layer arranged on the piezoelectric layer. The ultrasound transducer may be referred to as a unimorph ultrasound transducer.

In various embodiments, the substrate may include silicon, silicon dioxide, or titanium. The first electrode layer and the second electrode layer may include either molybdenum, or aluminium, or any other suitable electrically conductive materials. The piezoelectric layer may include lead zirconate titanate, or aluminium nitride, or any other suitable piezoelectric materials.

In various embodiments, at least one of the first electrode layer and the second electrode layer may include an inner circle portion and an outer ring portion separated by a gap.

In various embodiments, the multi-layered membrane may be un-patterned such that diameters of various layers of the multi-layered membrane may be substantially similar. In various embodiments, the multi-layered membrane may be patterned such that a diameter of the substrate is larger than a diameter of the first electrode layer, the diameter of the first electrode layer is larger than a diameter of the piezoelectric layer, and the diameter of the piezoelectric layer is larger than a diameter of the second electrode layer.

According to various embodiments, the multi-layered membrane may include a first electrode layer, a second electrode layer, a third electrode layer, a first piezoelectric layer arranged inbetween the first electrode layer and the second electrode layer, and a second piezoelectric layer arranged inbetween the second electrode layer and the third electrode layer, wherein the second electrode layer is arranged inbetween the first piezoelectric layer and the second piezoelectric layer. The ultrasound transducer may be referred to as a bimorph ultrasound transducer.

In various embodiments, at least one of the first electrode layer and the third electrode layer may include an inner circle portion and an outer ring portion separated by a gap.

According to various embodiments, one or more layers of the multi-layered membrane may be configured to have various thicknesses and diameters, thereby providing various resonant frequencies of the multi-layered membrane.

Various embodiments further provide a method of forming an ultrasound transducer. The method may include providing a multi-layered membrane; and forming a plurality of slits extending through the membrane, thereby forming a plurality of sections of the membrane at least partially separated by the slits. Each slit may extend from a perimeter of the membrane to a respective end position at a predetermined distance away from a center of the membrane. The plurality of sections of the membrane may be connected to each other at the center of the membrane.

According to various embodiments, the method may further include forming a first electrode layer on a substrate; forming a piezoelectric layer on the first electrode layer; and forming a second electrode layer on the piezoelectric layer, thereby forming the multi-layered membrane. The method may further include forming the plurality of slits extending through the first electrode layer, the piezoelectric layer and the second electrode layer.

In various embodiments, the method may include forming the plurality of slits extending through the substrate, the first electrode layer, the piezoelectric layer and the second electrode layer.

According to various embodiments, the method may further include forming a first electrode layer on a substrate; forming a first piezoelectric layer on the first electrode layer, forming a second electrode layer on the first piezoelectric layer; forming a second piezoelectric layer on the second electrode layer, forming a third electrode layer on the second piezoelectric layer, thereby forming the multi-layered membrane. The method may further include forming the plurality of slits extending through the first electrode layer, the first piezoelectric layer, the second electrode layer, the second piezoelectric layer and the third electrode layer; and removing a selected area of the substrate to expose the first electrode layer from a bottom surface of the first electrode layer.

In various embodiments, the method may further include at least one of: etching a portion of the first electrode layer to form an inner circle portion and an outer ring portion of the first electrode layer; or etching a portion of the third electrode layer to form an inner circle portion and an outer ring portion of the third electrode layer.

Various embodiments of the ultrasound transducer and the method of forming the ultrasound transducer are described in more detail below with reference to figures.

FIG. 1 shows a schematic diagram illustrating an ultrasound transducer according to various embodiments.

As shown in FIG. 1, the ultrasound transducer includes a multi-layered membrane 100, which is shown in a top view or a bottom view. The top view and the bottom view of the membrane 100 may be the same. The multi-layered membrane 100 may be at least partially fixed, for example, may be clamped around at least a perimeter 104 of the multi-layered membrane 100.

The membrane 100 includes a plurality of slits 102 extending through the membrane 100, thereby forming a plurality of sections 112, 114, 116, 118 of the membrane 100 at least partially separated by the slits 102. Each slit 102 extends from the perimeter 104 of the membrane 100 to a respective end position at a predetermined distance away from a center 106 of the membrane 100. The plurality of sections 112, 114, 116, 118 of the membrane are connected to each other at the center 106 of the membrane, which may allow the various sections 112, 114, 116, 118 to vibrate upwards and downwards in phase with each other.

The separation of the various sections 112, 114, 116, 118 along the length of the slits 102 allows the membrane 100 to expand upwards more easily, since the at least partially decoupled sections 112, 114, 116, 118 do not pull back each other during the upward expansion of the membrane.

According to various embodiments, the plurality of slits 102 may extend through the membrane 100 along a direction at least substantially perpendicular to the membrane, or along other directions in other embodiments, e.g. along an oblique direction through the layers of the membrane. The plurality of slits 102 may extend through the entire thickness of the membrane 100, i.e., through all layers of the multi-layered membrane 100.

In various embodiments, each slit 102 may extend radially from the perimeter of 104 the membrane 100 to the respective end position at the predetermined distance away from the center 106 of the membrane 100, or vice versa. In the embodiments shown in FIG. 1, each slit 102 extends along a respective radius of the membrane 100 from the perimeter 104 of the membrane to the respective end position, and converges towards the center portion 106 of the membrane 100. The longitudinal axis of each slit 102, or a line connecting the two ends of the slit 102 may extend radially towards the center portion 106 of the membrane.

According to various embodiments, each slit 102 may have a width in a range of 0.1%-15% of the radius of the multi-layered membrane 100. By way of example, the width of each slit 102 may be about 0.2%, 0.5%, 0.8%, 1%, 5%, 8%, 10%, 12%, or 14% of the radius of the multi-layered membrane 100.

According to various embodiments, a length of each slit 102 is in a range of 10%-90% of the radius of the multi-layered membrane 100. By way of example, the length of each slit 102 may be about 15%, 20%, 40%, 60%, or 80% of the radius of the multi-layered membrane 100.

According to various embodiments shown in FIG. 1, the end positions of the plurality of slits 102 may be located at the same predetermined distance away from the center 106 of the membrane. The predetermined distance may be, e.g., 10%-90% of the radius of the membrane. According to various embodiments, the end positions of the plurality of slits may be located at various or different distances away from the center of the membrane.

According to various embodiments, the length of each slit 102 is substantially larger than the width, which forms narrow slits to maximize the remaining sections of the membrane.

The area of the slits 102 may be a small fraction of the area of the membrane 100. By making the area of the slits 102 small, majority of the area of the membrane 100 which may for example include piezoelectric material, is retained, so as to provide as much actuation power as possible.

In the embodiments shown in FIG. 1, four slits 102 are evenly disposed in the disk-shaped membrane 100, so as to at least partially separate the membrane 100 into four sections 112, 114, 116, 118 having substantially equal areas.

It is understood that in various other embodiments, various numbers (e.g., 2, 3, 5, 6, 7, 8, 9, 10, etc.) of slits may be formed in the membrane, which may or may not be evenly disposed in the membrane.

The multi-layered membrane 100 is shown as a disc-shaped membrane in the embodiments of FIG. 1. It is understood that the multi-layered membrane may be in other suitable shapes, e.g., ellipse, square, rectangle, polygon, etc.

According to various embodiments, each slit 102 may be a rectangular shaped slit as shown in FIG. 1. In various other embodiments, the slits 102 may be any other shaped slits, for example, spiral shaped slit, curved slit, tapered slit, etc. The plurality of slits 102 may be in the same shape, or may be in different shapes.

According to various embodiments, the multi-layered membrane 100 may include at least a piezoelectric layer and two electrode layers (not shown) sandwiching the piezoelectric layer, which will be described in more detail in FIGS. 3 to 5 below.

According to various embodiments, one or more layers of the multi-layered membrane may be configured to have various thicknesses and diameters, thereby providing various resonant frequencies of the multi-layered membrane.

According to various embodiments, at least one of the two electrode layers may be patterned to include an inner circle portion 122 and an outer ring portion 124 separated by a gap 126. By supplying a positive voltage to the inner circle 122 and supplying a negative voltage to the outer ring 124, the membrane 100 may bend upwards. In various embodiments, the inner circle 122 and the outer ring 124 may be supplied with voltages of opposite polarity for optimal actuation. The optimum radii of the inner circle 122 and the outer ring 124 may be determined using finite element software, such as COMSOL Multiphysics, Ansys, or Coventorware.

Figure 2:
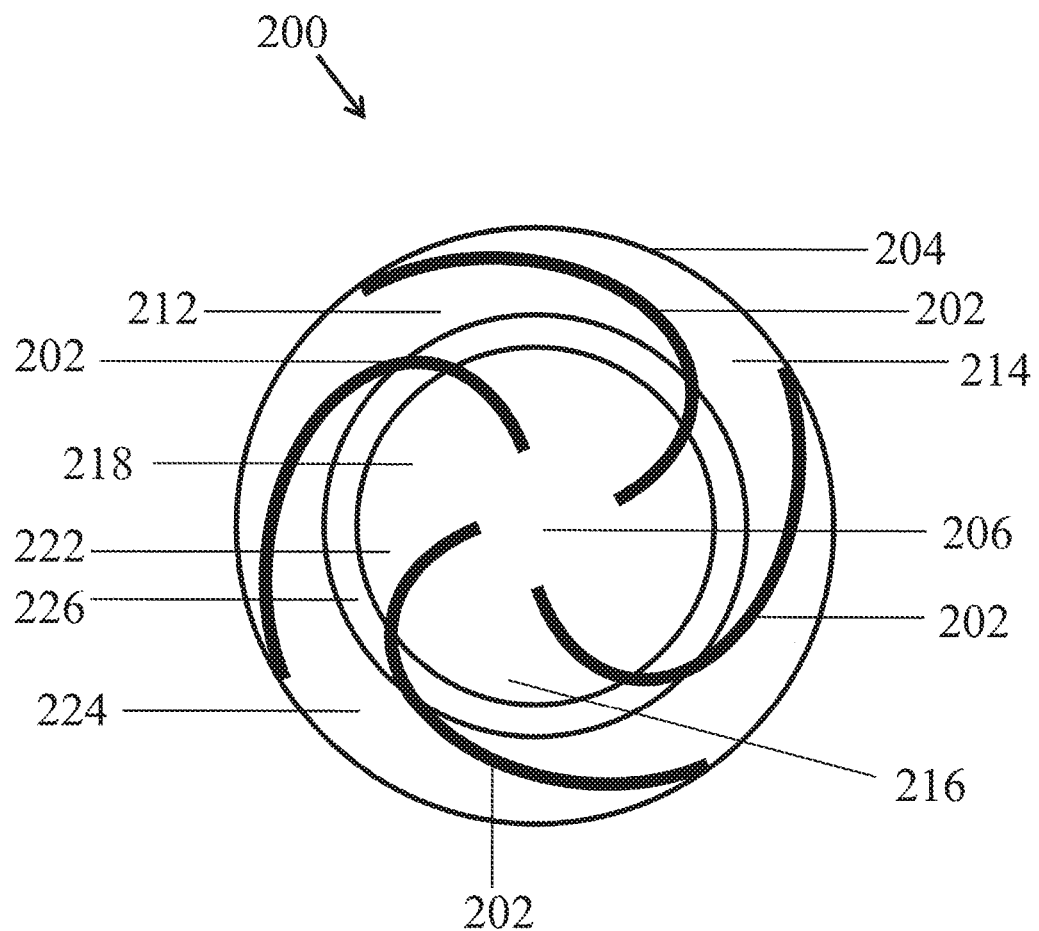
FIG. 2 shows a schematic diagram illustrating an ultrasound transducer according to various embodiments.

FIG. 2 shows a schematic diagram illustrating an ultrasound transducer according to various embodiments.

As shown in FIG. 2, the ultrasound transducer includes a multi-layered membrane 200, which is shown in a top view or a bottom view. The top view and the bottom view of the membrane 200 may be the same. The multi-layered membrane 200 may be at least partially fixed, for example, may be clamped around at least a perimeter 204 of the multi-layered membrane 100.

Similar to the membrane 100 described in the embodiments of FIG. 1 above, the membrane 200 in the embodiments of FIG. 2 includes a plurality of slits 202 extending through the membrane 200 so as to form a plurality of sections 212, 214, 216, 218 of the membrane 200 at least partially separated by the slits 202. Each slit 202 extends from the perimeter 204 of the membrane 200 to a respective end position at a predetermined distance away from a center 206 of the membrane 200. The plurality of sections 212, 214, 216, 218 of the membrane are connected to each other at the center 206 of the membrane, which may allow the various sections 212, 214, 216, 218 to vibrate upwards and downwards in phase with each other. Various embodiments described with regard to FIG. 1 above are analogously valid for the ultrasound transducer of FIG. 2, and vice versa.

The embodiments of FIG. 2 shows the plurality of slits 202 in different shapes from the slits 102 in FIG. 1 above, and accordingly the plurality of sections 212, 214, 216, 218 of the membrane 200 separated by the slits 202 are in different shapes from the sections 112, 114, 116, 118 of the membrane 100.

In the embodiments of FIG. 2, the slits 202 are shown as spiral shaped slits. The spiral shaped slits 202 extend spirally from the perimeter 204 of the membrane 200 to the respective end positions at the predetermined distance away from the center 206 of the membrane 200. In the embodiments of FIG. 2, a tangent at the end portion of each slit 202 may be through the center 206 of the membrane, in other words, along the radius of the membrane. In other embodiments, the tangent at the end portion of the slit 202 may not be through the center of the membrane.

FIG. 1 and FIG. 2 show some embodiments of the slits. In various other embodiments, the slits may be formed in any suitable shapes and may be oriented/extended in any suitable manner, with one end of each slit located at the perimeter of the membrane and the other end located within the membrane at the predetermined distance away from the center of the membrane, so as to divide the membrane into a plurality of sections at least partially separated from each other by the slits and connected to each other at the center of the membrane.

Figure 3:
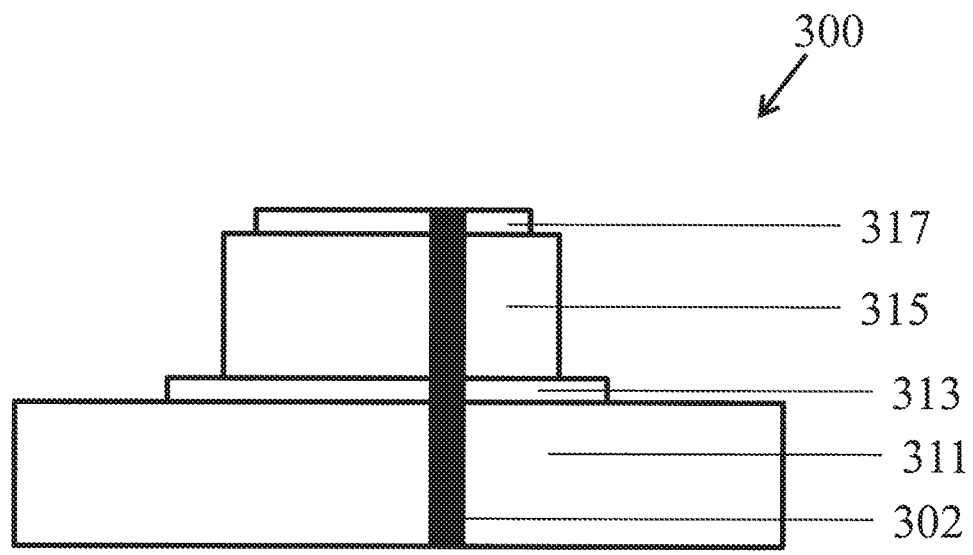
FIG. 3 shows a schematic diagram illustrating a cross-section view of an ultrasound transducer according to various embodiments.

FIG. 3 shows a schematic diagram illustrating a cross-section view of an ultrasound transducer according to various embodiments.

As shown in FIG. 3, the ultrasound transducer includes a multi-layered membrane 300 having a plurality of slits 302 extending through the entire thickness of the membrane 300, wherein only one slit is shown in FIG. 3. Various embodiments of the multi-layered membrane and the slits as described in various embodiments of FIGS. 1 and 2 above are analogously valid for the embodiments of FIG. 3, and vice versa.

According to various embodiments, the multi-layered membrane 300 may include a substrate 311, a first electrode layer 313 (which may be referred to as a bottom electrode) arranged on the substrate 311, a piezoelectric layer 315 arranged on the first electrode layer 313, and a second electrode layer 317 (which may be referred to as a top electrode) arranged on the piezoelectric layer 315. The ultrasound transducer according to the embodiments of FIG. 3 may be referred to as a unimorph ultrasound transducer.

In various embodiments, the substrate 311 may include silicon, silicon dioxide, or titanium. The first electrode layer 313 and the second electrode layer 317 may include either molybdenum, or aluminium, or any other suitable electrically conductive materials. The piezoelectric layer 315 may include lead zirconate titanate, or aluminium nitride, or any other suitable piezoelectric materials.

According to various embodiments, one or more layers of the multi-layered membrane 300 may be configured to have various thicknesses and diameters, thereby providing various resonant frequencies of the multi-layered membrane.

In various embodiments, the thicknesses and diameters of the various layers of the membrane 300 may be changed to modify the resonant frequencies of the membrane. Ultrasound transducers operating at low frequencies may be used by robots and automobiles for range-finding, in mobile phones and gaming consoles for gesture recognition, and by medical professionals for the thrombolysis of biological tissues. Ultrasound transducers operating at high frequencies may be used for medical imaging.

In various embodiments as show in FIG. 3, the multi-layered membrane 300 may be patterned such that a diameter of the substrate 311 is larger than a diameter of the first electrode layer 313, the diameter of the first electrode layer 313 is larger than a diameter of the piezoelectric layer 315, and the diameter of the piezoelectric layer 315 is larger than a diameter of the second electrode layer 317. The first electrode layer 313, the piezoelectric layer 315 and the second electrode layer 317 may be patterned by lithography and etching, for example, to have different diameters.

In various embodiments, the multi-layered membrane 300 may be patterned such that a diameter of the piezoelectric layer 315 is smaller than a diameter of the substrate 311. The piezoelectric layer 315 may be patterned by lithography and etching, for example, to have a smaller diameter. The diameters of the first electrode layer 313 and the second electrode layer 317 may be the same as or may be different from the diameter of the piezoelectric layer 315.

According to various embodiments, the top electrode 317 and the bottom electrode 313 may be configured to supply a voltage to the piezoelectric layer 315. To actuate the membrane 300, an alternating voltage may be supplied to the top electrode 317, and the bottom electrode 313 may be electrically grounded.

Figure 4:
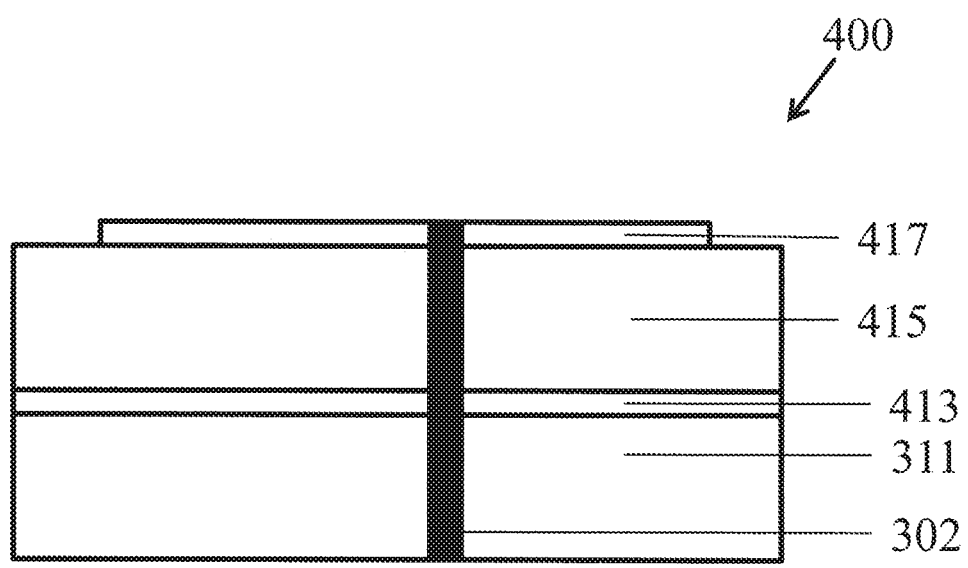
FIG. 4 shows a schematic diagram illustrating a cross-section view of an ultrasound transducer according to various embodiments.

FIG. 4 shows a schematic diagram illustrating a cross-section view of an ultrasound transducer according to various embodiments.

Similar to the embodiments of FIG. 3, the ultrasound transducer of FIG. 4 includes a multi-layered membrane 400 having a plurality of slits 302 extending through the entire thickness of the membrane 400, wherein only one slit is shown in FIG. 4. Various embodiments of the multi-layered membrane and the slits as described in various embodiments of FIGS. 1-3 above are analogously valid for the embodiments of FIG. 4, and vice versa.

Similar to the embodiments of FIG. 3, the ultrasound transducer of FIG. 4 is a unimorph ultrasound transducer. The multi-layered membrane 400 may include the substrate 311, a first electrode layer 413 (which may be referred to as a bottom electrode) arranged on the substrate 311, a piezoelectric layer 415 arranged on the first electrode layer 413, and a second electrode layer 417 (which may be referred to as a top electrode) arranged on the piezoelectric layer 415.

The first electrode layer 413, the piezoelectric layer 415 and the second electrode layer 417 may be similar to the first electrode layer 313, the piezoelectric layer 315 and the second electrode layer 317 of FIG. 3, respectively.

In the embodiments shown in FIG. 4, the top electrode 417 and the bottom electrode 413 are not separated into inner circle and outer rings, different from the embodiments of FIG. 1 and FIG. 2 above. In other embodiments, one or both of the top electrode 417 and the bottom electrode 413 may include an inner circle portion and an outer ring portion separated by a gap, similar to the embodiments as shown in FIG. 1 and FIG. 2.

In the embodiments of FIG. 4, the first electrode layer 413 and the piezoelectric layer 415 are not patterned, and have the same diameter as the substrate 311. The second electrode layer 417 may be patterned to have a smaller diameter than the piezoelectric layer 415, as shown in FIG. 4.

Figure 5:
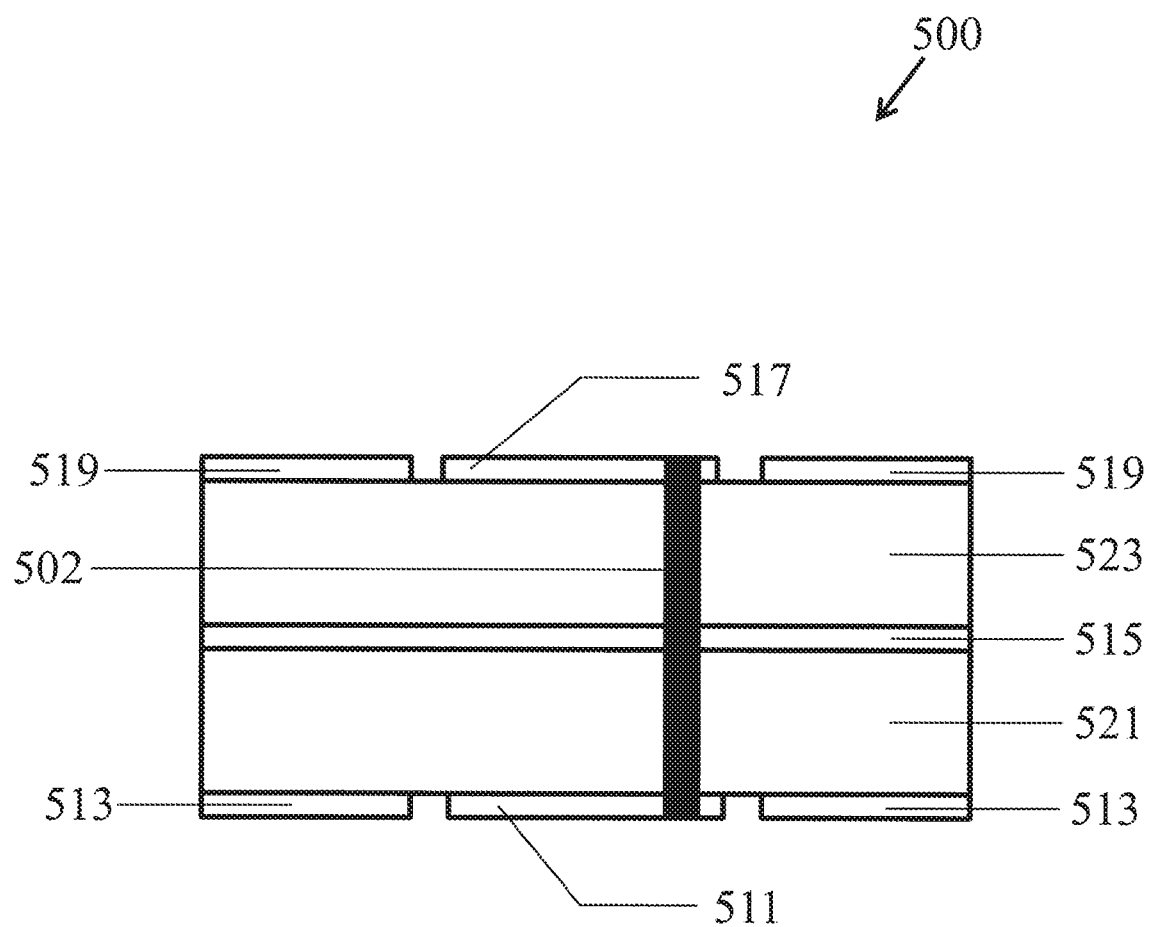
FIG. 5 shows a schematic diagram illustrating a cross-section view of an ultrasound transducer according to various embodiments.

FIG. 5 shows a schematic diagram illustrating a cross-section view of an ultrasound transducer according to various embodiments.

As shown in FIG. 5, the ultrasound transducer includes a multi-layered membrane 500 having a plurality of slits 502 extending through the entire thickness of the membrane 500, wherein only one slit is shown in FIG. 5. Various embodiments of the multi-layered membrane and the slits as described in various embodiments of FIGS. 1-4 above are analogously valid for the embodiments of FIG. 5, and vice versa.

The ultrasound transducer according to the embodiments of FIG. 5 may be a bimorph ultrasound transducer, which includes two piezoelectric layers and three electrode layers.

As shown in FIG. 5, the multi-layered membrane 500 may include a first electrode layer 511, 513 (which may be referred to as a bottom electrode), a second electrode layer 515 (which may be referred to as a middle electrode), a third electrode layer 517, 519 (which may be referred to as a top electrode), a first piezoelectric layer 521 arranged inbetween the first electrode layer 511, 513 and the second electrode layer 515, and a second piezoelectric layer 523 arranged inbetween the second electrode layer 515 and the third electrode layer 517, 519. The second electrode layer 515 is arranged inbetween the first piezoelectric layer 521 and the second piezoelectric layer 523.

In various embodiments, the electrode layers 511, 513, 515, 517, 519 may include either molybdenum or aluminium, or any other suitable electrically conductive materials. The piezoelectric layers 521, 523 may include lead zirconate titanate, or aluminium nitride, or any other suitable piezoelectric materials.

In various embodiments, at least one of the first electrode layer and the third electrode layer may include an inner circle portion and an outer ring portion separated by a gap, similar to the embodiments as shown in FIG. 1 and FIG. 2 above. In the embodiments shown in FIG. 5, the bottom electrode may include an inner circle portion 511 and an outer ring portion 513 separated by a gap. The top electrode may include an inner circle portion 517 and an outer ring portion 519 separated by a gap.

According to various embodiments, the middle electrode 515 may be configured to supply a voltage to both piezoelectric layers 521, 523. The top electrode 517, 519 may be configured to supply a voltage to the second piezoelectric layer 523. The bottom electrode 511, 513 may be configured to supply a voltage to the first piezoelectric layer 521. In an embodiment to actuate the membrane 500, an alternating voltage may be supplied to the top and bottom electrodes 511, 513, 517, 519, and the middle electrode 515 may be electrically grounded.

According to various embodiments, one or more layers of the multi-layered membrane 500 may be configured to have various thicknesses and diameters, thereby providing various resonant frequencies of the multi-layered membrane. In various embodiments, the thicknesses and diameters of the various layers of the membrane 500 may be changed to modify the resonant frequencies of the membrane, so as to provide ultrasound transducers operating at low frequencies and high frequencies for various applications.

According to various embodiments described with reference to FIGS. 1-5 above, multiple narrow slits are provided which extend from a predetermined/fixed distance from the centre of the multi-layered membrane to the circumference of the membrane. This allows the various sections of the membrane to be partially decoupled from each other.

When the membrane of the ultrasound transducer is actuated up and down, the partial decoupling of the sections according to various embodiments above allows all sections and the entire membrane to expand upwards more freely and more easily. This allows the membrane to have a greater expansion and a greater displacement, thus resulting in a greater acoustic pressure being generated.

According to various embodiments above, slits are not formed in the center of the membrane, so as to allow the center of the membrane to connect all sections of the membrane together. The various partially decoupled sections are connected to each other at the centre of the membrane, which causes them to vibrate in phase with each other. When the plurality of sections vibrate in phase with each other at the same resonant frequency, the acoustic pressure generated is greater than that generated when the sections vibrate out of phase. This is because the acoustic waves interfere constructively to increase the amplitude of the pressure of the acoustic wave. If the sections vibrate out of phase, the acoustic waves will interfere destructively, which will reduce the amplitude of the pressure of the acoustic wave.

By retaining the centre area of the membrane according to various embodiments above, more piezoelectric material area of the membrane is retained for greater actuation. This provides a greater driving force in the membrane, which results in greater membrane displacement and hence greater acoustic pressure being generated.

By achieving greater acoustic pressure, the ultrasound transducer according to various embodiments, when used as an ultrasound transmitter, is able to achieve a greater transmission range and penetration depth, thereby improving the imaging resolution for applications like medical imaging, range finding and gesture recognition. A greater acoustic pressure also allows the ultrasound transmitter to break up blood clots and cells more easily, for example. This is beneficial to removing blood clots in patients and for blood diagnostics where the cells need to be broken up to release the bio-marker proteins for disease detection.

By making the slits very narrow according to various embodiments, there is reduced loss of piezoelectric material. Retaining the piezoelectric material is important for driving the membrane up and down.

According to various embodiments, the thicknesses and diameters of the various layers of the membrane may be adjusted to modify the resonant frequencies of the membrane, so as to provide ultrasound transducers operating at various frequencies for different applications. Ultrasound transducers operating at low frequencies may be used by robots and automobiles for range-finding, in mobile phones and gaming consoles for gesture recognition, and by medical professionals for the thrombolysis of biological tissues. Ultrasound transducers operating at high frequencies may be used for medical imaging.

Figure 6:
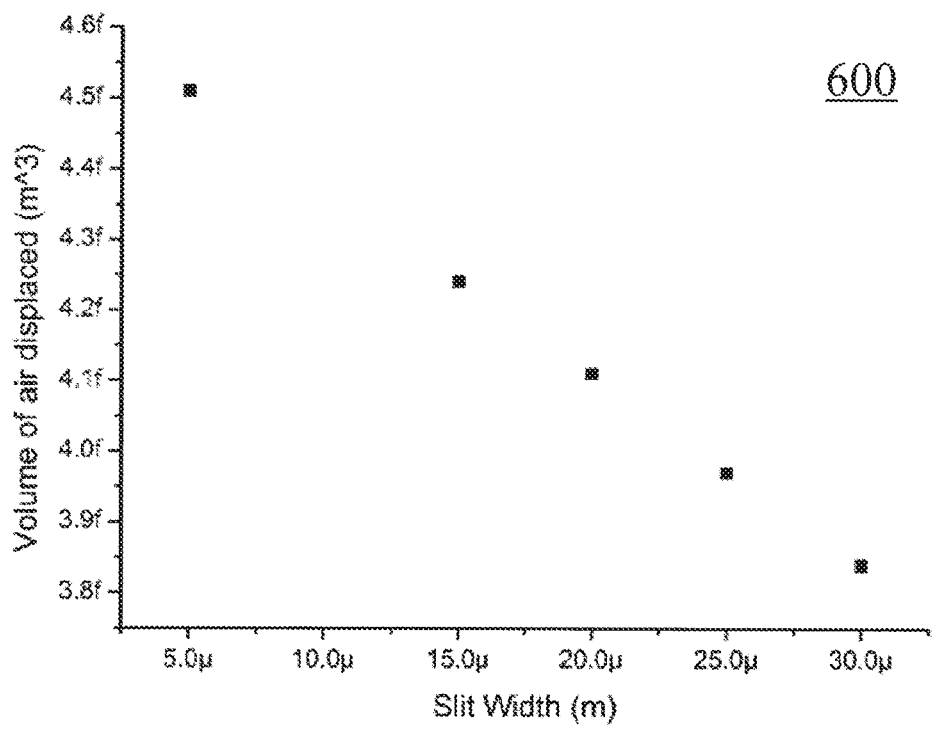
FIG. 6 shows a plot illustrating the volume of air displaced by the membrane under static deflection, as a function of the width of the slits according to various embodiments.

FIG. 6 shows a plot 600 illustrating the volume of air displaced by the membrane under static deflection, as a function of the width of the slits according to various embodiments.

The volume of the air displaced is calculated by performing a surface integral of the displacement at each point, over the area of the membrane. The simulation model used to generate the results of FIG. 6 uses an ultrasound transducer having 8 slits formed in the membrane. As shown in FIG. 6, the slits may have a width in the range of 5 μm-30 μm. As the slits become narrower, the area of the membrane is increased, leading to a greater volume of air displaced and hence demonstrating improved performance.

Figure 7:
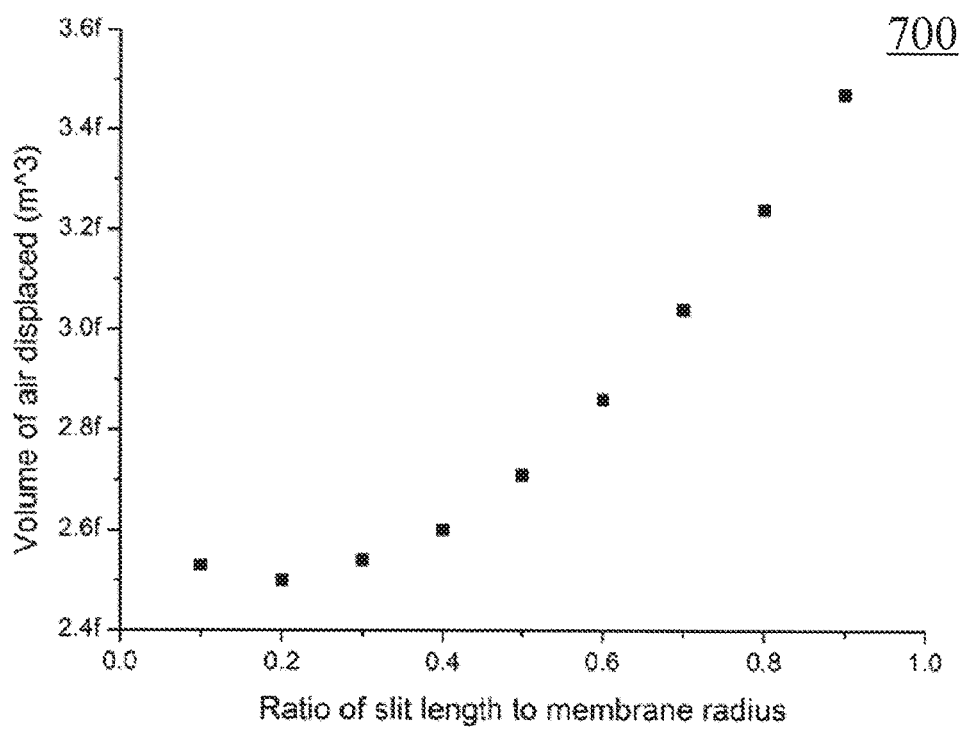
FIG. 7 shows a plot illustrating the volume of air displaced by the membrane, as a function of the ratio of slit length to the radius of the membrane according to various embodiments.

FIG. 7 shows a plot 700 illustrating the volume of air displaced by the membrane, as a function of the ratio of slit length to the radius of the membrane according to various embodiments.

The simulation model used to generate the results of FIG. 7 uses an ultrasound transducer having 8 slits formed in the membrane. Simulation results in FIG. 7 show that increasing the slits' length relative to the radius of the membrane will lead to a greater volume of air displaced.

Figure 8:
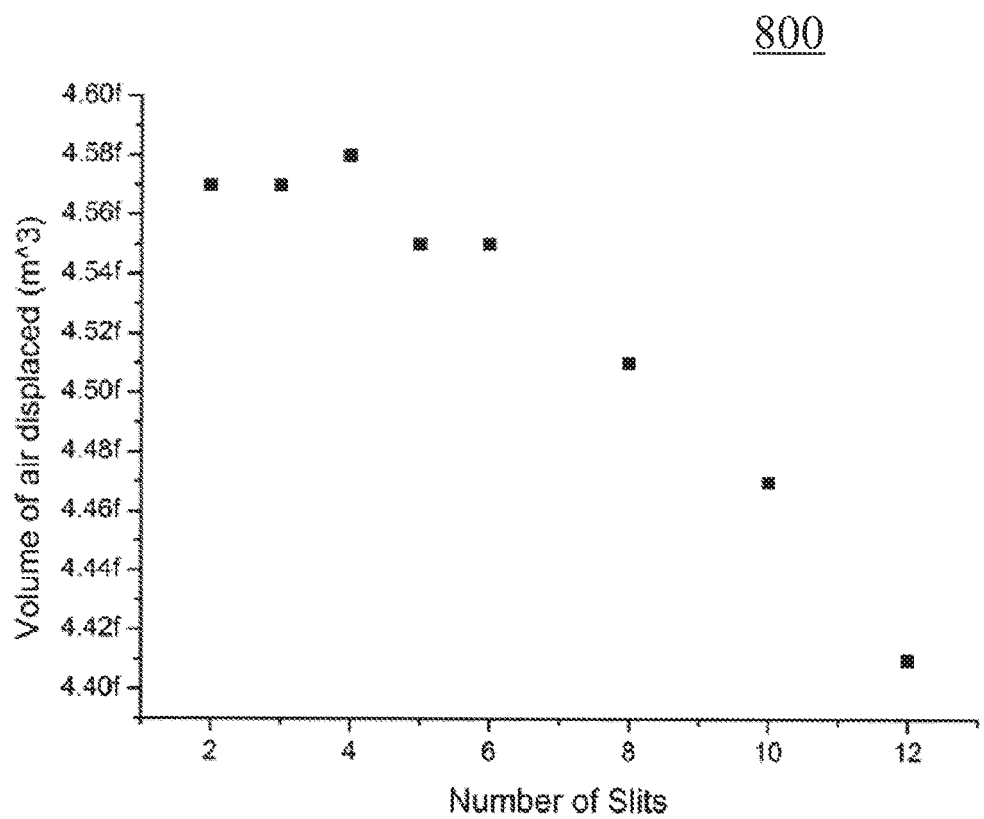
FIG. 8 shows a plot illustrating the volume of air displaced by the membrane, as a function of the number of slits according to various embodiments.

FIG. 8 shows a plot 800 illustrating the volume of air displaced by the membrane, as a function of the number of slits according to various embodiments.

As shown in FIG. 8, various number of slits, e.g. from 2 to 12, is used in the simulation. The simulation results in FIG. 8 show that the volume of air displaced is the maximum when four slits are used in the membrane of the ultrasound transducer of various embodiments above.

Figure 9:
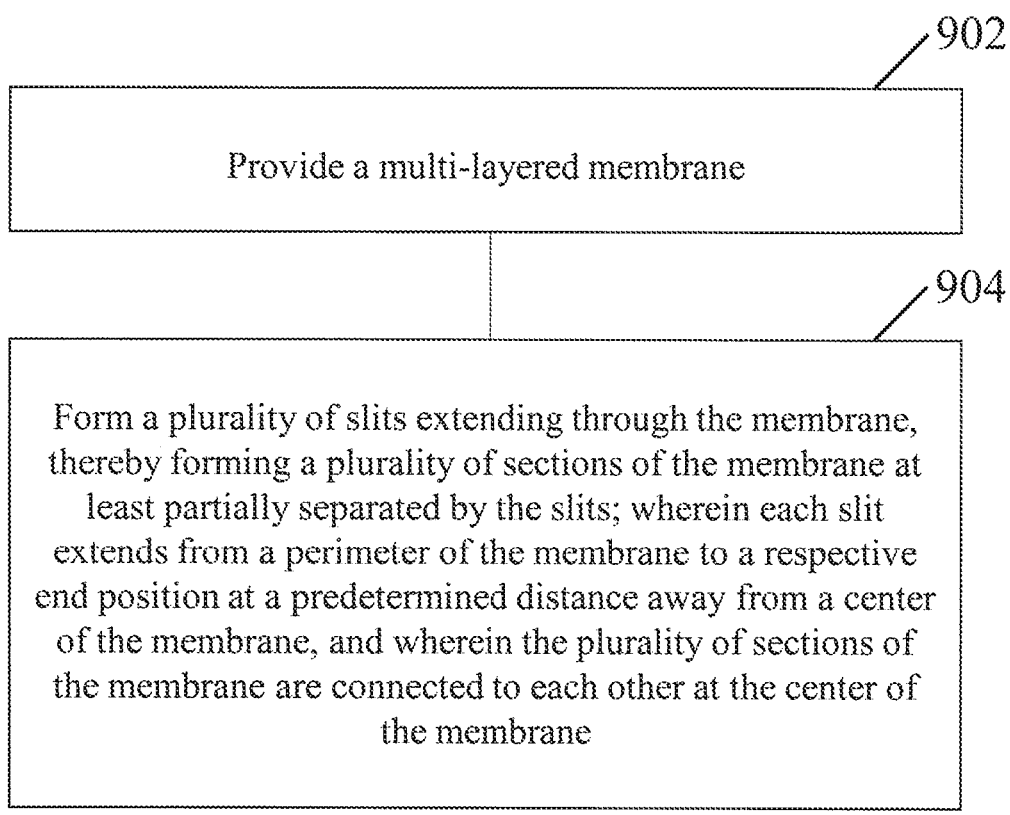
FIG. 9 shows a flowchart illustrating a method of forming an ultrasound transducer according to various embodiments.

FIG. 9 shows a flowchart 900 illustrating a method of forming an ultrasound transducer according to various embodiments. The method illustrated below may be used to form the ultrasound transducer described in various embodiments of FIGS. 1-5 above. Various embodiments of the ultrasound transducer described above are analogously valid for the embodiments of the method below, and vice versa.

At 902, a multi-layered membrane is provided.

At 904, a plurality of slits extending through the membrane is formed, thereby forming a plurality of sections of the membrane at least partially separated by the slits. Each slit may extend from a perimeter of the membrane to a respective end position at a predetermined distance away from a center of the membrane. The plurality of sections of the membrane may be connected to each other at the center of the membrane.

According to various embodiments, the plurality of slits may be formed by etching.

According to various embodiments, the method may further include forming a first electrode layer on a substrate; forming a piezoelectric layer on the first electrode layer; and forming a second electrode layer on the piezoelectric layer, thereby forming the multi-layered membrane. The method may further include forming the plurality of slits extending through the first electrode layer, the piezoelectric layer and the second electrode layer.

In various embodiments, the method may include forming the plurality of slits extending through the substrate, the first electrode layer, the piezoelectric layer and the second electrode layer.

According to various embodiments, the method may further include forming a first electrode layer on a substrate; forming a first piezoelectric layer on the first electrode layer, forming a second electrode layer on the first piezoelectric layer; forming a second piezoelectric layer on the second electrode layer; forming a third electrode layer on the second piezoelectric layer, thereby forming the multi-layered membrane. The method may further include forming the plurality of slits extending through the first electrode layer, the first piezoelectric layer, the second electrode layer, the second piezoelectric layer and the third electrode layer, and removing a selected area of the substrate to expose the first electrode layer from a bottom surface of the first electrode layer.

In various embodiments, the method may further include at least one of: etching a portion of the first electrode layer to form an inner circle portion and an outer ring portion of the first electrode layer; or etching a portion of the third electrode layer to form an inner circle portion and an outer ring portion of the third electrode layer.

In exemplary embodiments, a fabrication process for forming the unimorph ultrasound transducer of FIG. 3 and FIG. 4 above are described in detail below.

The fabrication process may start with a silicon-on-insulator (SOI) wafer. The device layer of the SOI wafer may be used as the substrate 311. Thin films of molybdenum 313, 317, 413, 417 and aluminium nitride 315, 415 are deposited on top of the substrate 311. The top layer of molybdenum 317, 417 may be patterned through lithography and etching. Subsequently, the aluminium nitride layer 315 may be patterned. Thereafter, the bottom molybdenum layer 313 may be patterned. In order to release the substrate 311 from the layers beneath it, a hole is etched into the handle and buried oxide layers of the SOI wafer, from the backside of the wafer. Thereafter, the structure 300, 400 of FIG. 3 and FIG. 4 is formed.

In exemplary embodiments, a fabrication process for forming the bimorph ultrasound transducer of FIG. 5 above are described in detail below.

The fabrication process may start with a blank silicon wafer. A thin film of molybdenum is first deposited on the silicon wafer. The patterned inner circle 511 and outer ring 513 of the bottom molybdenum layer may be formed through lithography and etching. Thereafter, the bottom aluminium nitride layer 521, middle molybdenum layer 515, top aluminium nitride layer 523, and top molybdenum layer are deposited. The patterned inner circle 517 and outer ring 519 of the top molybdenum layer are formed through lithography and etching. In order to release the bottom molybdenum layer 511, 513 from the silicon material beneath it, a hole is etched from the backside of the wafer. Thereafter, the structure 500 of FIG. 5 is formed.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An ultrasound transducer, comprising:
   a multi-layered membrane comprising a plurality of slits extending through the membrane, thereby forming a plurality of sections of the membrane at least partially separated by the slits;
   wherein each slit extends from a perimeter of the membrane to a respective end position at a predetermined distance away from a center point of the membrane,
   wherein the plurality of sections of the membrane are connected to each other at the center point of the membrane.

2. The ultrasound transducer of claim 1, wherein the plurality of slits extend through the membrane along a direction at least substantially perpendicular to the membrane.

3. The ultrasound transducer of claim 1, wherein each slit extends radially from the perimeter of the membrane to the respective end position at the predetermined distance away from the center point of the membrane.

4. The ultrasound transducer of claim 1, wherein each slit extends along a radius of the membrane from the perimeter of the membrane to the respective end position.

5. The ultrasound transducer of claim 1, wherein a tangent at the end portion of each slit is through the center point of the membrane.

6. The ultrasound transducer of claim 1, wherein the center point of the membrane is a center of gravity of the membrane.

7. The ultrasound transducer of claim 1, wherein the multi-layered membrane is a disc-shaped membrane.

8. The ultrasound transducer of claim 1, wherein the multi-layered membrane is clamped around at least a portion of the perimeter.

9. The ultrasound transducer of claim 1, wherein each slit is one of a rectangular shaped slit or a spiral shaped slit.

10. The ultrasound transducer of claim 1, wherein each slit has a width in a range of 0.1%-15% of a radius of the multi-layered membrane.

11. The ultrasound transducer of claim 1, wherein a length of each slit is in a range of 10%-90% of a radius of the multi layered membrane.

12. The ultrasound transducer of claim 1, wherein the multi-layered membrane comprises a substrate, a first electrode layer arranged on the substrate, a piezoelectric layer arranged on the first electrode layer, and a second electrode layer arranged on the piezoelectric layer.

13. The ultrasound transducer of claim 12, wherein the multi-layered membrane is patterned such that a diameter of the substrate is larger than a diameter of the first electrode layer, the diameter of the first electrode layer is larger than a diameter of the piezoelectric layer, and the diameter of the piezoelectric layer is larger than a diameter of the second electrode layer.

14. The ultrasound transducer of claim 1, wherein the multi-layered membrane comprises:
   a first electrode layer,
   a second electrode layer,
   a third electrode layer,
   a first piezoelectric layer arranged inbetween the first electrode layer and the second electrode layer, and
   a second piezoelectric layer arranged inbetween the second electrode layer and the third electrode layer, wherein the second electrode layer is arranged inbetween the first piezoelectric layer and the second piezoelectric layer.

15. The ultrasound transducer of claim 14, wherein at least one of the first electrode layer and the third electrode layer comprises an inner circle portion and an outer ring portion separated by a gap.

16. The ultrasound transducer of claim 1, wherein one or more layers of the multi-layered membrane are configured to have various thicknesses and diameters, thereby providing various resonant frequencies of the multi-layered membrane.

17. A method of forming an ultrasound transducer, the method comprising:
   providing a multi-layered membrane; and
   forming a plurality of slits extending through the membrane, thereby forming a plurality of sections of the membrane at least partially separated by the slits;
   wherein each slit extends from a perimeter of the membrane to a respective end position at a predetermined distance away from a center point of the membrane,
   wherein the plurality of sections of the membrane arc connected to each other at the center point of the membrane.

18. The method of claim 17, further comprising:
   forming a first electrode layer on a substrate;
   forming a piezoelectric layer on the first electrode layer;
   forming a second electrode layer on the piezoelectric layer, thereby forming the multi layered membrane; and
   forming the plurality of slits extending through the first electrode layer, the piezoelectric layer and the second electrode layer.

19. The method of claim 17, further comprising:
   forming a first electrode layer on a substrate;
   forming a first piezoelectric layer on the first electrode layer;
   forming a second electrode layer on the first piezoelectric layer;
   forming a second piezoelectric layer on the second electrode layer;
   forming a third electrode layer on the second piezoelectric layer, thereby forming the multi-layered membrane;

forming the plurality of slits extending through the first electrode layer, the first piezoelectric layer, the second electrode layer, the second piezoelectric layer and the third electrode layer; and removing a selected area of the substrate to expose the first electrode layer from a bottom surface of the first electrode layer.

20. The method of claim 19, further comprising at least one of:

etching a portion of the first electrode layer to form an inner circle portion and an outer ring portion of the first electrode layer; or etching a portion of the third electrode layer to form an inner circle portion and an outer ring portion of the third electrode layer.

\* \* \* \* \*